(12) United States Patent
Kuroda et al.

(10) Patent No.: US 7,956,383 B2
(45) Date of Patent: Jun. 7, 2011

(54) FIELD EFFECT TRANSISTOR

(75) Inventors: Masayuki Kuroda, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 393 days.

(21) Appl. No.: 12/060,505

(22) Filed: Apr. 1, 2008

(65) Prior Publication Data

US 2008/0258243 A1    Oct. 23, 2008

(30) Foreign Application Priority Data

Apr. 20, 2007 (JP) .................................. 2007-111451

(51) Int. Cl.
*H01L 31/072* (2006.01)
(52) U.S. Cl. ........ 257/192; 257/103; 257/189; 257/194; 257/330; 257/E29.127; 257/E29.252
(58) Field of Classification Search .................. 257/103, 257/189, 192, 194, 330, E29.127, E29.252
See application file for complete search history.

(56) References Cited

U.S. PATENT DOCUMENTS

2006/0124962 A1* 6/2006 Ueda et al. .................... 257/192
2006/0157729 A1* 7/2006 Ueno et al. .................... 257/103

FOREIGN PATENT DOCUMENTS

JP    2006-173294    6/2006

OTHER PUBLICATIONS

Higashiwaki, M. et al., "AlGaN/GaN Heterostructure Field-Effect Transistors with Current Gain Cut-off Frequency of 152 GHz on Sapphire Substrates," J.J. Appl. Phys. vol. 44, pp. L475-L478, 2005.
Wang, R. et al., "Enhancement-Mode $Si_3N_4$/AlGaN/GaN MISHFETs," IEEE Electron Device Lett., vol. 27, No. 10, pp. 793-795, Oct. 2006.

* cited by examiner

*Primary Examiner* — Andy Huynh
(74) *Attorney, Agent, or Firm* — McDermott Will & Emery LLP

(57) ABSTRACT

A field effect transistor includes: a first nitride semiconductor layer having a plane perpendicular to a (0001) plane or a plane tilted with respect to the (0001) plane as a main surface; a second nitride semiconductor layer formed on the first nitride semiconductor layer and having a wider bandgap than the first nitride semiconductor layer; a third nitride semiconductor layer formed on the second nitride semiconductor layer; and a source electrode and a drain electrode formed so as to contact at least a part of the second nitride semiconductor layer or the third nitride semiconductor layer. A recess that exposes a part of the second nitride semiconductor layer is formed between the source electrode and the drain electrode in the third nitride semiconductor layer. A gate electrode is formed in the recess and an insulating film is formed between the third nitride semiconductor layer and the gate electrode.

8 Claims, 12 Drawing Sheets

| | SHEET CARRIER CONCENTRATION BEFORE SiN FORMATION (cm$^{-2}$) | SHEET CARRIER CONCENTRATION AFTER SiN FORMATION (cm$^{-2}$) |
|---|---|---|
| a-PLANE Al$_{0.25}$Ga$_{0.75}$N 25nm/GaN HFET (INVENTION) | 5.6×10$^{12}$ | 4.5×10$^{12}$ |
| c-PLANE Al$_{0.25}$Ga$_{0.75}$N 25nm/GaN HFET (COMPARATIVE EXAMPLE) | 1.1×10$^{13}$ | 2.0×10$^{13}$ |
| c-PLANE Al$_{0.4}$Ga$_{0.6}$N 6nm/GaN HFET (DOCUMENT 1) | 5.6×10$^{12}$ | 2.3×10$^{13}$ |

US 7,956,383 B2

FIELD EFFECT TRANSISTOR

CROSS REFERENCE TO RELATED APPLICATION

This application claims priority under 35 U.S.C. §119 on Patent Application No. 2007-111451 filed in Japan on Apr. 20, 2007, the entire contents of which are hereby incorporated by reference.

BACKGROUND OF THE INVENTION

1. Field of the Invention

The invention relates to a normally-off type nitride semiconductor field effect transistor that is used in a high breakdown voltage power transistor.

2. Background Art

A GaN (gallium nitride) based compound semiconductor has a high breakdown field and a high saturation electron velocity and therefore is a very attractive semiconductor material for a future power transistor that requires a low on-state resistance and a high breakdown voltage. In an AlGaN/GaN (aluminum gallium nitride/gallium nitride) heterostructure formed on a substrate having a (0001) plane as a main surface, charges are formed at the heterointerface by spontaneous polarization and piezoelectric polarization, and a sheet carrier concentration of $1 \times 10^{13}$ cm$^{-2}$ or more is obtained even in an undoped state. A high current density HFET (Hetero-junction Field Effect Transistor) has been implemented by using this high concentration 2DEG (2-Dimensional Electron Gas) at the heterointerface. A conventional AlGaN/GaN HFET is a so-called normally-on type HFET in which a source-drain current flows when a drain voltage is applied with a gate electrode of 0 V.

From a standpoint of the safety in case of power outage, operation with a single circuit power supply, and the like, a power transistor to be used in practical applications should be a so-called normally-off type power transistor in which no current flows when a gate voltage is 0 V. A normally-on type power transistor has safety problems; for example, a circuit is damaged in case of power outage. Moreover, the normally-on type power transistor is operated by applying a positive voltage to a drain electrode and a negative voltage to a gate electrode. Therefore, two power supplies, that is, positive and negative power supplies, are required for the normally-on type power transistor. However, a normally-off type power transistor is operated by applying a positive voltage to both a drain electrode and a gate electrode. Therefore, the normally-off type power transistor can be operated with a single power supply.

It is desirable that, when a gate voltage is increased, a normally-off type FET has a sufficiently low gate leakage current until a drain current is saturated. In a conventional Schottky gate structure, however, a significant forward current flows at a gate voltage Vg of about +1 V, and therefore, a gate leakage current flows before a drain current is saturated. Accordingly, instead of the Schottky gate structure, a gate structure in which a gate leakage current is low even when a positive gate voltage is applied is required for the normally-off type FET.

Hereinafter, a conventional normally-off type GaN-based FET will be described. A method for forming a MIS (Metal Insulator Semiconductor)-type AlGaN/GaN HFET as a low gate leakage current element by forming an SiN (silicon nitride) insulating film under a gate electrode has been reported (e.g., see Japanese Laid-Open Patent Publication No. 2006-173294). Since SiN used as the insulating film has a wide bandgap, carriers are less likely to be transported between a gate metal and a semiconductor layer, and a gate leakage current can be reduced as compared to the Schottky gate structure.

It has been recently reported that, in such an AlGaN/GaN MIS-HFET, forming an insulating film of, e.g., SiN on an AlGaN barrier layer increases a sheet carrier concentration at the AlGaN/GaN heterointerface (e.g., see M. Higashiwaki, T. Matsui, "AlGaN/GaN Heterostructure Field-Effect Transistors with Current Gain Cut-off Frequency of 152 GHz on Sapphire Substrates," J. J. Appl. Phys. vol. 44 (2005), L475; hereinafter, this document is referred to as Document 1). In Document 1, a high current MIS-HFET having excellent high frequency characteristics is implemented by making positive use of a high concentration 2DEG.

However, in order to implement both a low gate leakage current and a normally-off type operation, it is desirable that the sheet carrier concentration at the AlGaN/GaN interface does not increase in the MIS structure as well. In other words, in order to obtain a normally-off type FET while reducing a gate leakage current, it is necessary to compensate not only for polarized charges produced by a polarization effect but for increased sheet carriers in the MIS structure to deplete the AlGaN/GaN interface under a gate electrode.

A normally-off type AlGaN/GaN MIS-HFET in which a 2DEG at the AlGaN/GaN interface is depleted by implanting fluorine (F) ions into an AlGaN layer directly below a gate electrode by plasma processing and an SiN film is formed between the gate electrode and an AlGaN layer has been reported as a MIS-HFET that meets the above requirements (e.g., see R. Wang, Y. Cai, C. W. Tang, K. M. Lau, K. J. Chen, "Enhancement-Mode Si$_3$N$_4$/AlGaN/GaN MISHFETs," IEEE Electron Device Lett., vol. 27, no. 10, pp. 793-795, October 2006).

However, detailed physical properties of the conventional normally-off type AlGaN/GaN MIS-HFET involving fluorine implantation have not been clarified. Moreover, the element is damaged by the plasma processing for fluorine implantation into the AlGaN layer, causing degradation in operation characteristics of the element or fluctuation for reliability through device processing.

SUMMARY OF THE INVENTION

In view of the above problems, it is an object of the invention to obtain a low gate leakage current normally-off type Group-III nitride semiconductor field effect transistor without involving damage by plasma processing.

In order to achieve the above object, a field effect transistor of the invention is formed on a so-called nonpolar plane of a nitride semiconductor. This structure suppresses generation of charges from spontaneous polarization and piezoelectric polarization. Therefore, a normally-off type Group-III nitride semiconductor field effect transistor can be implemented. Moreover, since the nonpolar plane is used as a main surface, increase in sheet carriers in a channel layer from formation of an insulating film can be prevented. Therefore, shift of a threshold voltage to negative bias of the normally-off type field effect transistor can be prevented.

More specifically, a field effect transistor according to the invention includes: a first nitride semiconductor layer having a plane perpendicular to a (0001) plane or a plane tilted with respect to the (0001) plane as a main surface; a second nitride semiconductor layer formed on the first nitride semiconductor layer and having a wider bandgap than the first nitride semiconductor layer; a third nitride semiconductor layer formed on the second nitride semiconductor layer; a source electrode and a drain electrode formed so as to contact at least a part of the second nitride semiconductor layer or the third nitride semiconductor layer; a gate electrode provided between the source electrode and the drain electrode in the third nitride semiconductor layer and formed in a recess that exposes a part of the second nitride semiconductor layer; and an insulating film formed between the third nitride semiconductor layer and the gate electrode.

In the field effect transistor of the invention, the first nitride semiconductor layer has a plane perpendicular to the (0001) plane or a plane tilted with respect to the (0001) plane as a main surface. Therefore, generation of charges from spontaneous polarization and piezoelectric polarization can be suppressed. A normally-off type nitride semiconductor field effect transistor can thus be implemented. Moreover, since a plane perpendicular to the (0001) plane or a plane tilted with respect to the (0001) plane is used as a main surface of the first nitride semiconductor layer, increase in sheet carriers in a channel layer can be prevented when the insulating film is formed between the third nitride semiconductor layer and the gate electrode. Accordingly, reduction in a threshold voltage of the normally-off type field effect transistor can be prevented. Moreover, a normally-off type nitride semiconductor field effect transistor having a higher threshold voltage and excellent operation characteristics can be obtained by using a so-called gate recess structure.

In the field effect transistor of the invention, it is preferable that impurities providing n-type conductivity are doped in at least one of the second nitride semiconductor layer and the third nitride semiconductor layer.

By doping impurities providing n-type conductivity to the second nitride semiconductor layer, electrons serving as carriers can be supplied to the channel layer of the field effect transistor. Therefore, a series resistance of the transistor can be reduced. By doping impurities providing n-type conductivity to the third nitride semiconductor layer, a contact resistance with an ohmic electrode formed thereon can be reduced. With this structure, a normally-off type field effect transistor having a low series parasitic resistance can be implemented.

In the field effect transistor of the invention, it is preferable that the insulating film is formed so as to cover at least a part of each surface of the source electrode and the drain electrode.

This structure eliminates the need to remove the insulating film by a dry etching method before formation of ohmic electrodes, that is, the source electrode and the drain electrode. Therefore, a normally-off type nitride semiconductor field effect transistor can be obtained without involving damage by plasma processing.

It is preferable that the field effect transistor of the invention has normally-off characteristics.

This improves safety in case of, e.g., power outage and enables operation with a single circuit power supply.

In the field effect transistor of the invention, it is preferable that the insulating film is a single-layer film of SiN, $SiO_2$, $Al_2O_3$, $HfO_2$, or AlN, or a multi-layer film including at least two of SiN, $SiO_2$, $Al_2O_3$, $HfO_2$, and AlN.

A low gate leakage current normally-off type nitride semiconductor field effect transistor can thus be implemented.

In the field effect transistor of the invention, it is preferable that the plane perpendicular to the (0001) plane or the plane tilted with respect to the (0001) plane is a (11-20) plane, a (1-100) plane, a (1-101) plane, a (1-102) plane, a (11-22) plane, or a (11-24) plane.

By using such a nonpolar or semipolar plane as a main surface of each nitride semiconductor layer, generation of charges from spontaneous polarization or piezoelectric polarization as generated on the (0001) plane in the conventional example can be suppressed. As a result, a normally-off type nitride semiconductor field effect transistor can be implemented.

In the field effect transistor of the invention, it is preferable that the first nitride semiconductor layer is made of GaN, the second nitride semiconductor layer is made of $Al_xGa_{1-x}N$ (0<x<1), and the third nitride semiconductor layer is made of GaN.

In this case, a 2DEG is formed at the heterointerface between the first nitride semiconductor layer and the second nitride semiconductor layer at a gate bias voltage higher than a threshold voltage, and electrons can travel through the 2DEG as a channel. Accordingly, a normally-off type nitride semiconductor field effect transistor having a low series resistance can be implemented. Moreover, since the third nitride semiconductor layer can be used as a low resistance GaN cap layer, a normally-off type nitride semiconductor field effect transistor having a low series parasitic resistance can be formed.

As has been described above, a low gate leakage current normally-off type nitride semiconductor field effect transistor can be implemented by the invention.

BRIEF DESCRIPTION OF THE DRAWINGS

FIG. 13A shows the case in which a gate electrode is provided directly on a c-plane AlGaN/GaN HFET, and FIG. 13B shows the case in which a SiN film is formed between a c-plane AlGaN/GaN HFET and a gate electrode; FIG. 13C shows the case in which a gate electrode is provided directly on an a-plane AlGaN/GaN HFET in a comparative example, and FIG. 13D shows the case in which a SiN film is formed between an a-plane AlGaN/GaN HFET and a gate electrode in the invention.

DETAILED DESCRIPTION OF THE PREFERRED EMBODIMENTS

Embodiment

A field effect transistor according to an embodiment of the invention will now be described with reference to the accompanying drawings. In the following description, an a-plane indicates a (11-20) plane, an r-plane indicates a (1-102) plane, and a c-plane indicates a (0001) plane unless otherwise mentioned. For convenience, a negative sign given to a Miller index of plane orientation indicates inversion of an index following the negative sign.

Figure 1:
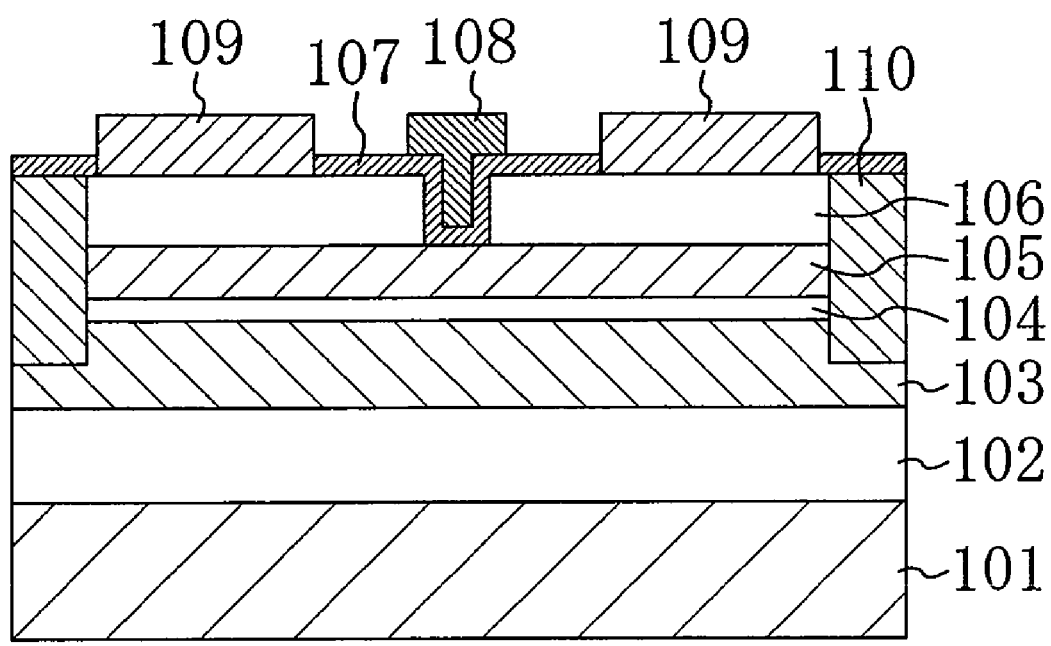
FIG. 1 is a cross-sectional view of a field effect transistor according to an embodiment of the invention.

FIG. 1 shows a cross-sectional structure of an AlGaN/GaN heterojunction field effect transistor having an a-plane as a main surface (hereinafter, simply referred to as an a-plane AlGaN/GaN HFET) according to a first embodiment of the invention.

As shown in FIG. 1, for example, an AlN (aluminum nitride) buffer layer 102 having a thickness of 500 nm, an undoped GaN layer 103 having a thickness of 3 nm, an AlN spacer layer 104 having a thickness of 1 nm, an n-type $Al_xGa_{1-x}N$ barrier layer 105 (0<x<1) having a thickness of 15 nm, and an n-type GaN cap layer 106 having a thickness of 50 nm are sequentially formed on a sapphire substrate 101 in this order by crystal growth. The sapphire substrate 101 has an r-plane as a main surface, and each of the buffer layer 102, the undoped GaN layer 103, the AlN spacer layer 104, the n-type $Al_xGa_{1-x}N$ barrier layer 105, and the n-type GaN cap layer 106 has an a-plane as a main surface.

The n-type $Al_xGa_{1-x}N$ barrier layer 105 herein has an Al composition of 0.25. The spacer layer 104 formed between the GaN layer 103 and the barrier layer 105 need not necessarily be provided.

A part of the cap layer 106 is removed by, e.g. a dry etching method to form a recess (opening) exposing the barrier layer 105 from the cap layer 106. A SiN gate insulating film 107 having a thickness of 3 nm is formed so as to cover the side surface and the bottom surface of the recess.

A high resistance isolation layer 110 is formed at both ends of each layer from the cap layer 106 to the upper portion of the GaN layer 103 by implantation of, e.g., boron ($B^+$) ions. The isolation layer 110 may be formed by a mesa isolation method or a selective oxidation method.

A Ti/Al (titanium/aluminum) ohmic electrode (source-drain electrode) 109 is formed on both sides of the recess on the cap layer 106 at a distance from the recess. A PdSi (palladium silicon) gate electrode 108 is formed as a so-called recess gate in the recess in the cap layer 106 with the gate insulating film 107 interposed therebetween.

In this embodiment, the n-type AlGaN barrier layer 105 has a thickness of 15 nm. However, in the case where a thinner barrier layer 105 is formed so that a depletion layer formed under the gate electrode 108 reaches a channel of the GaN layer 103, the channel can be pinched off without application of a gate voltage. In this case, a threshold voltage of the normally-off type AlGaN/GaN HFET can further be increased. Accordingly, the thickness of the barrier layer 105 is not limited to 15 nm, and the barrier layer 105 may be thinner than 15 nm.

The MIS gate structure is used in this embodiment. However, a MES (Metal Semiconductor) gate structure may be used as long as normally-off type characteristics can be obtained.

In this embodiment, an electrode contact resistance is reduced by forming the n-type GaN cap layer 106 having an a-plane as a main surface by doping n-type impurities at a high concentration, and forming the source/drain electrode 109 on the n-type GaN cap layer 106. With this structure, a sufficiently low contact resistance of $2.7 \times 10^{-6}$ $\Omega cm^2$ can be obtained between the source/drain electrode 109 and the cap layer 106. Accordingly, a normally-off type a-plane AlGaN/GaN HFET having a low source-drain series resistance can be obtained.

The cap layer 106 may alternatively be formed by forming n-type doped $Al_{0.25}Ga_{0.75}N/GaN$ periodically, for example, with seven periods, with a thickness of 50 nm, or may be an $In_xAl_yGa_{1-x-y}N$ (indium aluminum gallium nitride) layer (0<x<1, 0<y<1, and 0<x+y<1). In order to reduce a contact resistance, a so-called ohmic recess structure may be formed by forming a recess under the ohmic electrode 109 in the cap layer 106 so that the ohmic electrode 109 contacts the barrier layer 105.

Typical dimensions of the field effect transistor of this embodiment are as follows: the gate recess has a width of 0.6 μm in the gate length direction; the upper portion of the gate electrode 108 has a gate length of 1.0 μm; and both ends of the upper portion of the gate electrode 108 in the gate length direction overlap the cap layer 106 with a width of 0.2 μm. In other words, the field effect transistor of this embodiment has a narrow recess structure. In this structure, a 2DEG layer is formed near a heterojunction at the interface between the GaN layer 103 and the spacer layer 104 under the gate electrode 108 when a gate bias voltage higher than the threshold voltage is applied. Therefore, electrons serving as carriers travel through a path formed by the source electrode 109, the cap layer 106 under the source electrode 109, the 2DEG layer, the cap layer 106 under the drain electrode 109, and the drain electrode 109. Accordingly, in an on state, electrons can travel only in the 2DEG layer as a channel, whereby a low on-state resistance field effect transistor can be implemented. Since the gate electrode 108 and the cap layer 106 contact each other with the SiN gate insulating film 107 interposed therebetween, no significant gate leakage current is generated even when a forward voltage of 5 V or higher is applied.

More preferably, a channel resistance and a source resistance can be reduced by further reducing the width of the gate recess. A normally-off type a-plane AlGaN/GaN HFET having a low source-drain series resistance can thus be produced.

Figure 2A:
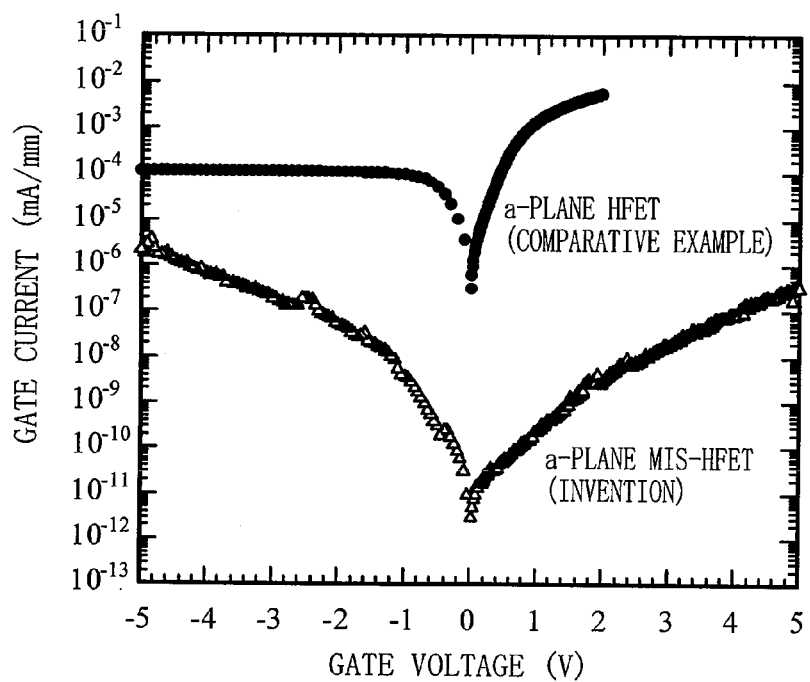
FIG. 2A is a graph showing current-voltage characteristics of a field effect transistor according to an embodiment of the invention and a comparative example by a logarithmic scale.

FIG. 2A shows gate-drain current-voltage characteristics in the a-plane AlGaN/GaN HFET according to this embodiment by a logarithmic scale. It can be seen from FIG. 2A that the MIS type HFET of the invention has a reduced reverse leakage current and the reverse leakage current can be reduced to $10^{-2}$ times at $V_g=-5$ V as compared to a Schottky gate MES type HFET of a comparative example.

Figure 2B:
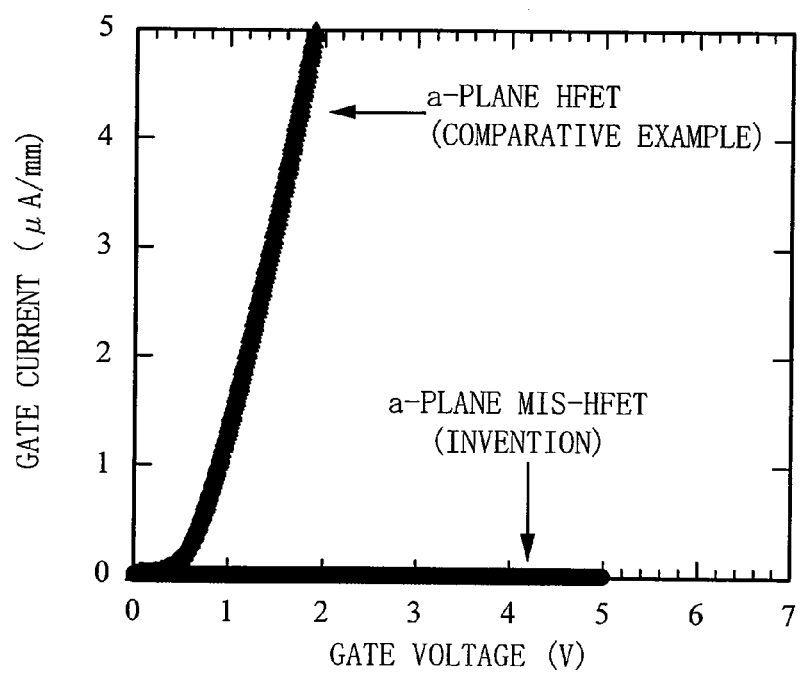
FIG. 2B is a graph showing current-voltage characteristics of a field effect transistor according to an embodiment of the invention and a comparative example by a linear scale.

FIG. 2B shows gate-drain forward current-voltage characteristics in the a-plane AlGaN/GaN HFET according to this embodiment by a linear scale. As shown in FIG. 2B, a forward rising voltage is about 0.5 V in the MES type HFET of the comparative example, while no significant gate leakage current is recognized in the MIS type HFET of the invention even when a forward voltage of 5 V is applied. A gate leakage current can thus be reduced by using a MIS gate structure.

The gate insulating film 107 is made of SiN in this embodiment. However, the gate insulating film may be made of any material such as $SiO_2$ (silicon dioxide), $HfO_2$ (hafnium dioxide), $Al_2O_3$ (aluminum oxide), or AlN as long as the same effects can be obtained. The gate insulating film may be a multi-layer film made of a combination of at least two kinds of the above insulating films.

Figures 3, 4:
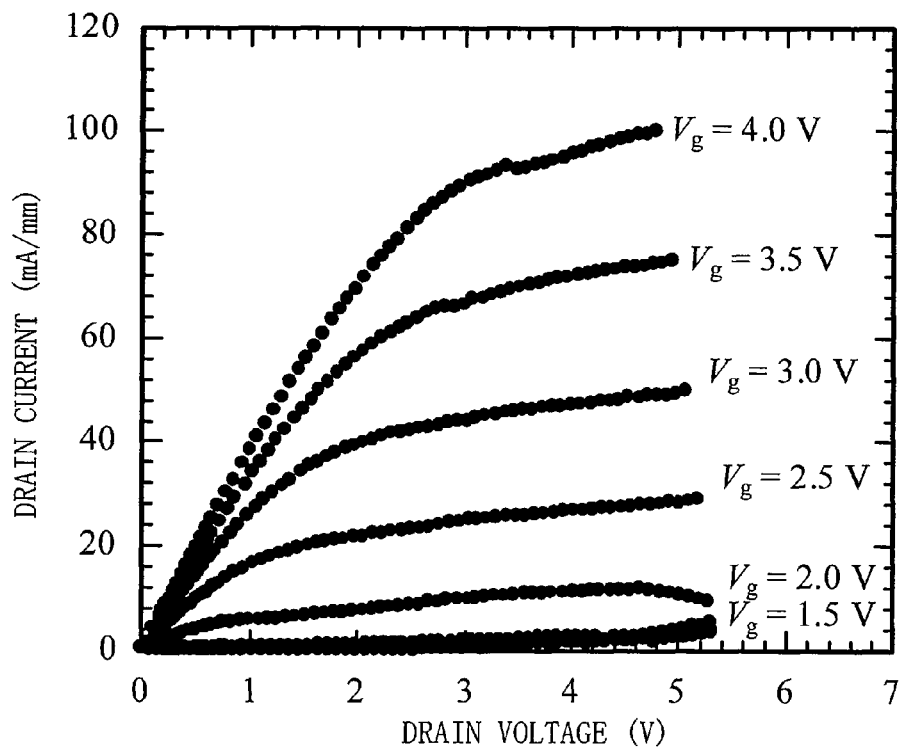
FIG. 3 is a table showing a change in a sheet carrier concentration before and after formation of a SiN gate insulating film in an a-plane AlGaN/GaN HFET as a field effect transistor according to an embodiment of the invention and a c-plane AlGaN/GaN HFET of a comparative example.
FIG. 4 is a graph showing current-voltage characteristics of a field effect transistor according to an embodiment of the invention.

FIG. 3 shows a change in a sheet carrier concentration before and after formation of the SiN gate insulating film 107 in the a-plane AlGaN/GaN HFET of this embodiment and a c-plane AlGaN/GaN HFET of a comparative example. An Al composition is 0.25 and an AlGaN layer has a thickness of 25 nm in the embodiment and the comparative example. In a c-plane AlGaN/GaN HFET of Document 1, an Al composition is 0.4 and an AlGaN layer has a thickness of 6 nm. It can be seen from the table that, in the a-plane $Al_{0.25}Ga_{0.75}N$ 25 nm/GaN MIS-HFET of the invention, the sheet carrier concentration hardly changes by formation of SiN. In the c-plane $Al_{0.25}Ga_{0.75}N$ 25 nm/GaN MIS-HFET of the comparative example, on the other hand, the sheet carrier concentration is approximately doubled by formation of SiN. In the c-plane $Al_{0.4}Ga_{0.6}N$ 6 nm/GaN MIS-HFET of Document 1, the sheet carrier concentration is increased to about four times by formation of SiN.

It has been reported that, in AlGaN/GaN MIS-HFETs having a c-plane as a main surface, a surface potential of an AlGaN layer (a barrier layer) is reduced and a sheet carrier concentration at the AlGaN/GaN heterointerface is increased when an insulating film such as SiN is formed on the surface of the AlGaN layer (Document 1). The same results were obtained by the experiments conducted by the inventors. A high current, high frequency MIS-HFET that includes a nitride semiconductor layer having a c-plane as a main surface has been reported by making positive use of this high sheet carrier concentration. In order to implement a normally-off type operation while reducing a gate leakage current, however, it is desirable that the sheet carrier concentration at the AlGaN/GaN interface does not increase in the MIS structure as well.

On the other hand, the sheet carrier concentration changes only slightly in the MIS-HFET that includes a nitride semiconductor layer having an a-plane as a main surface as in the invention. Therefore, both a low gate leakage current and a normally-off type operation can be implemented at the same time without taking into consideration a change in a threshold voltage by the MIS structure.

Hereinafter, the reason why a low gate leakage current and a normally-off type operation can be implemented at the same time will be described based on FIGS. 13A through 13D.

Figure 13A:
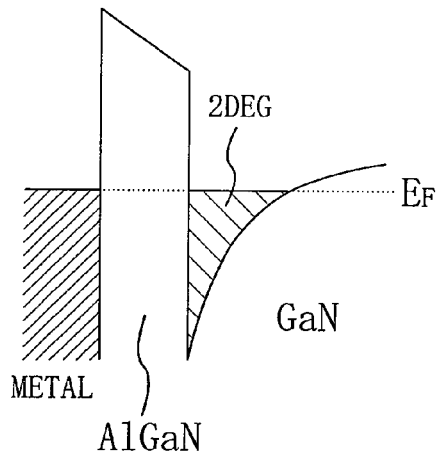
FIGS. 13A and 13B are schematic conduction band diagrams illustrating a behavior of a sheet carrier concentration at the AlGaN/GaN interface of a c-plane AlGaN/GaN HFET of a conventional example, where
Figure 13B:
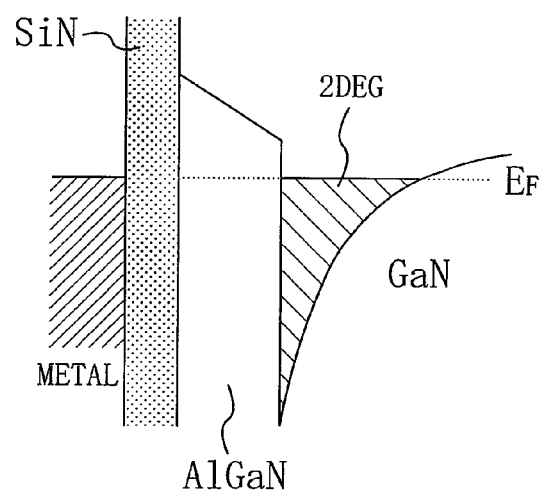

FIGS. 13A through 13D are schematic conduction band diagrams illustrating a behavior of a sheet carrier concentration at the AlGaN/GaN interface of an AlGaN/GaN HFET. As shown in FIGS. 13A and 13B, it can be considered that one of the causes that increase a sheet carrier concentration in a c-plane AlGaN/GaN HFET having a SiN film on the surface of an AlGaN layer is as follows: Si becomes donor impurities by Si—N bonding at the SiN/AlGaN interface, whereby positive charges are formed and a surface potential is reduced. As a result, electrons are compensated for at the AlGaN/GaN interface, and the concentration of a 2-dimensional electron gas (2DEG) layer is increased.

Figure 13C:
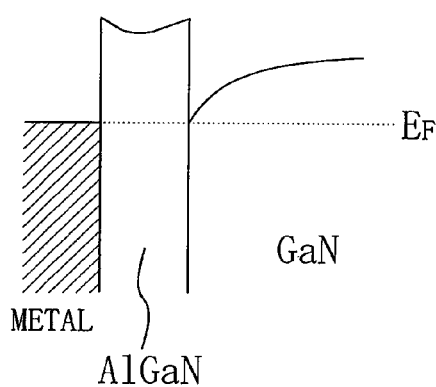
FIGS. 13C and 13D are schematic conduction band diagrams illustrating a behavior of a sheet carrier concentration at the AlGaN/GaN interface of an a-plane AlGaN/GaN HFET, where
Figure 13D:
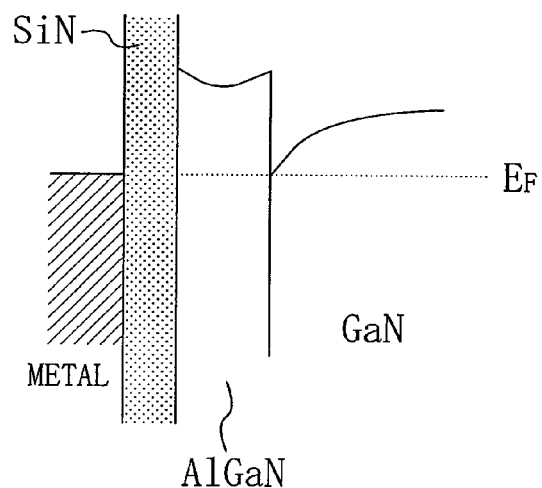

As shown in FIGS. 13C and 13D, however, in the case of the AlGaN/GaN HFET having an a-plane as a main surface according to the invention, Group-III atoms and Group-V atoms are located on the same plane. Accordingly, the number of dangling bonds of nitrogen at the topmost surface is one half of that on the c-plane. As a result, it is considered that the number of free electrons that are compensated for in the 2DEG layer by Si serving as donor impurities is reduced by Si—N bonding. Since increase in the sheet carrier concentration is reduced as compared to the case where the c-plane is used, a low gate leakage current and a normally-off type operation can be implemented at the same time without taking into consideration a change in a threshold voltage by the MIS structure.

FIG. 4 shows the relation between a drain current and a drain voltage of the field effect transistor of the embodiment. It can be seen from FIG. 4 that the threshold voltage is +1.3 V and a normally-off type field effect transistor is obtained.

Figure 5:
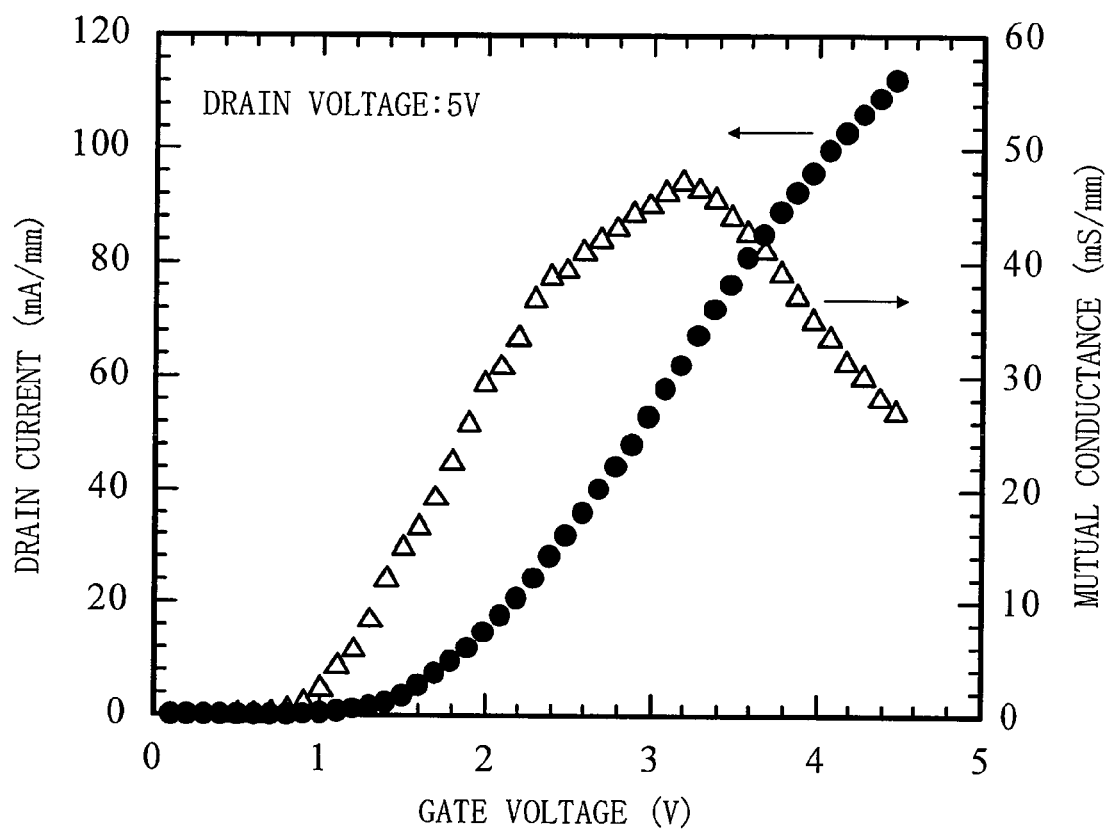
FIG. 5 is a graph showing transfer characteristics of a field effect transistor according to an embodiment of the invention.

FIG. 5 shows transfer characteristics of the field effect transistor of the embodiment. As shown in FIG. 5, a maximum drain current $I_{max}$ is 112 mA/mm and a maximum mutual conductance $g_{mmax}$ is 47 mS/mm.

Figure 6:
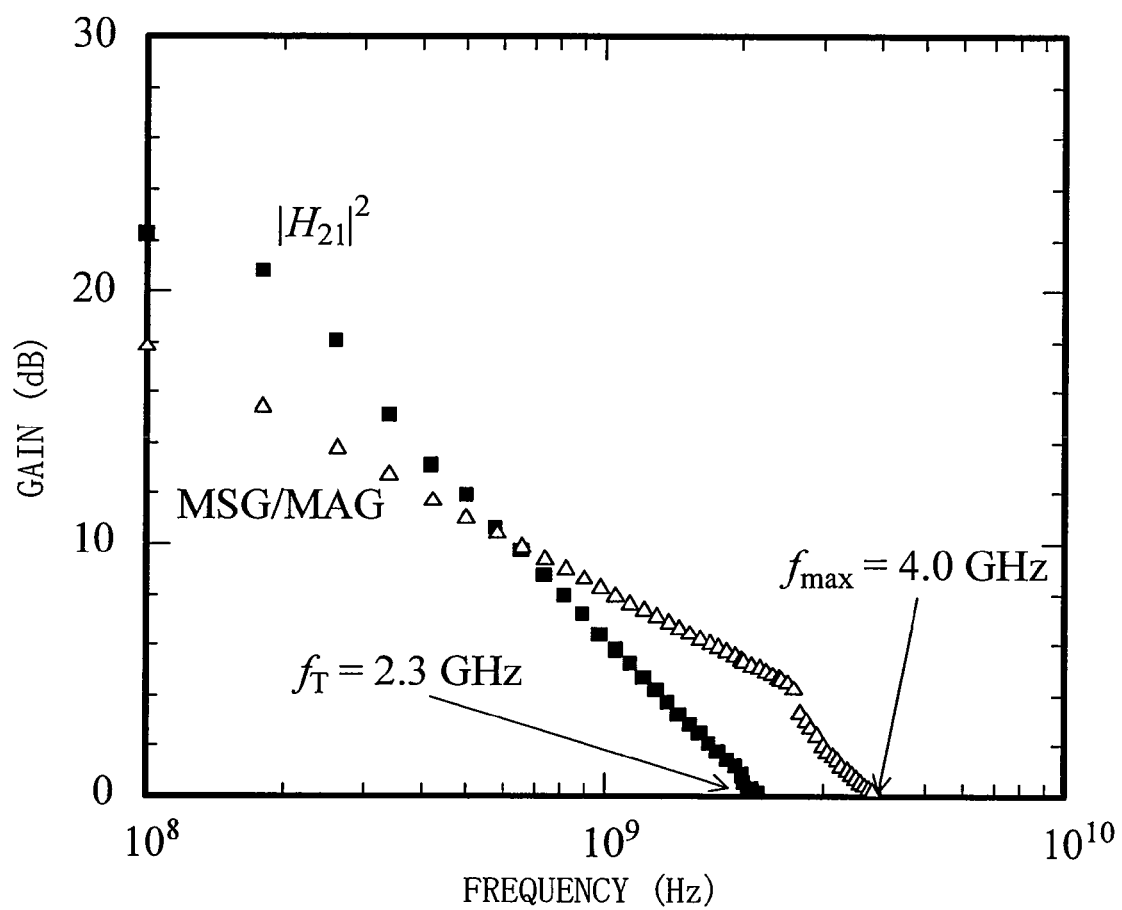
FIG. 6 is a graph showing high frequency characteristics of a field effect transistor according to an embodiment of the invention.

FIG. 6 shows frequency dependencies of a current gain and a maximum stable power gain (MSG) or maximum available power gain (MAG) calculated from a measured S parameter in the field effect transistor of the embodiment. It can be seen that, at a gate voltage $V_g$ of 4.5 V and a drain-source voltage $V_{ds}$ of 4.5 V, a current gain cutoff frequency ($f_T$) and a maximum oscillating frequency ($f_{max}$) in the field effect transistor are 2.3 GHz and 4.0 GHz, respectively.

In this embodiment, an a-plane (a (11-20) plane) is used as a main growth surface of each nitride semiconductor layer. However, a (1-100) plane, a (1-101) plane, a (1-102) plane, a (11-22) plane, or a (11-24) plane, or any other orientations may be used as long as the same effects can be obtained.

In this embodiment, a sapphire substrate having an r-plane as a main surface is used as the substrate 101. However, the invention is not limited to sapphire, and the substrate may be made of silicon carbide (SiC), gallium nitride (GaN), silicon (Si), or the like and the substrate may have any orientation as long as the same effects can be obtained.

Hereinafter, a method for manufacturing an a-plane AlGaN/GaN heterojunction field effect transistor having the above structure will be described with reference to the figures.

FIGS. 7A through 7C, FIGS. 8A through 8C, and FIG. 9 show cross-sectional structures sequentially illustrating the steps of a method for manufacturing a field effect transistor according to an embodiment of the invention.

Figure 7A:
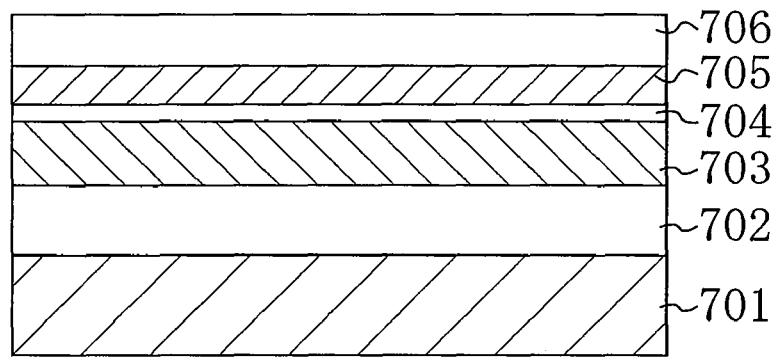
FIGS. 7A, 7B, and 7C are cross-sectional views sequentially illustrating the steps of a method for manufacturing a field effect transistor according to an embodiment of the invention.

As shown in FIG. 7A, an AlN buffer layer 702 having a thickness of 500 nm, an undoped GaN layer 703 having a thickness of 3 μm, an AlN spacer layer 704 having a thickness of 1 nm, an $Al_{0.25}Ga_{0.75}N$ barrier layer (electron supply layer) 705 having a thickness of 15 nm, and a Si-doped n-type GaN cap layer 706 having a thickness of 50 nm are sequentially epitaxially grown on a main surface of a sapphire substrate 701 by, for example, a MOCVD (Metal Organic Chemical Vapor Deposition) method. The substrate 701 has an r-plane as a main surface, and each of the buffer layer 702, the GaN layer 703, the spacer layer 704, the barrier layer 705, and the cap layer 706 has an a-plane as a main surface (a growth surface).

Figure 7B:
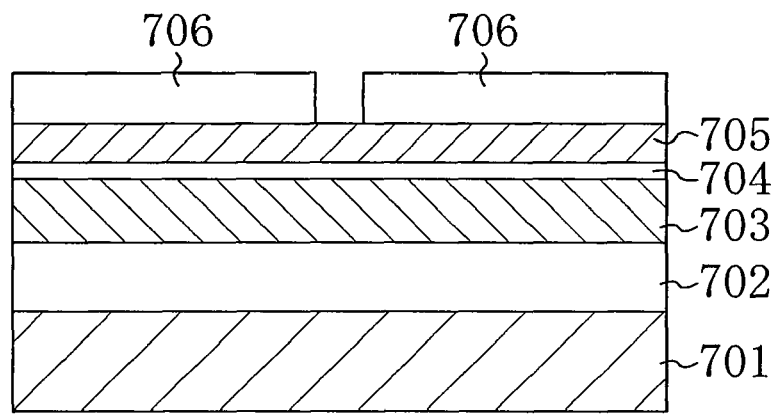

As shown in FIG. 7B, a recess (a gate recess) is then formed by selectively etching the cap layer 706 so as to expose the barrier layer 705 by a dry etching method such as an ICP (Inductively Coupled Plasma) method.

Figure 7C:
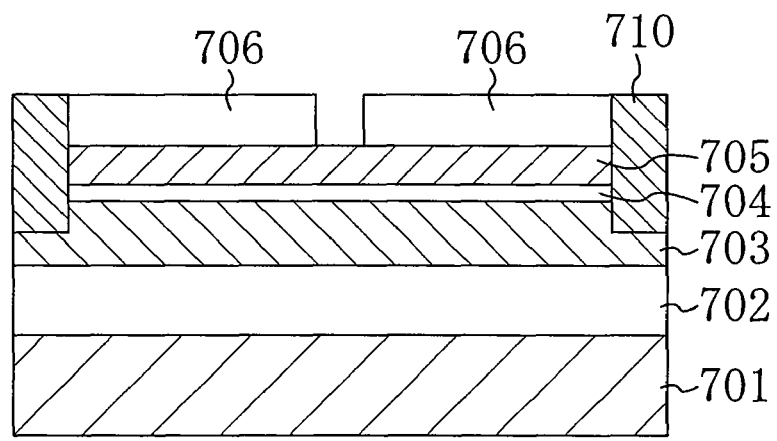

As shown in FIG. 7C, an isolation layer 710 is then formed on both side of the gate recess so that each isolation layer 710 is located at a distance from the gate recess. More specifically, the isolation layer 710 is formed by selectively implanting boron ($B^+$) ions from the cap layer 706 to the upper portion of the GaN layer 703 so as to selectively increase the resistance of each semiconductor layer. The process of increasing the resistance is not limited to the ion implantation method. For example, a selective thermal oxidation method may alternatively be used.

Figure 8A:
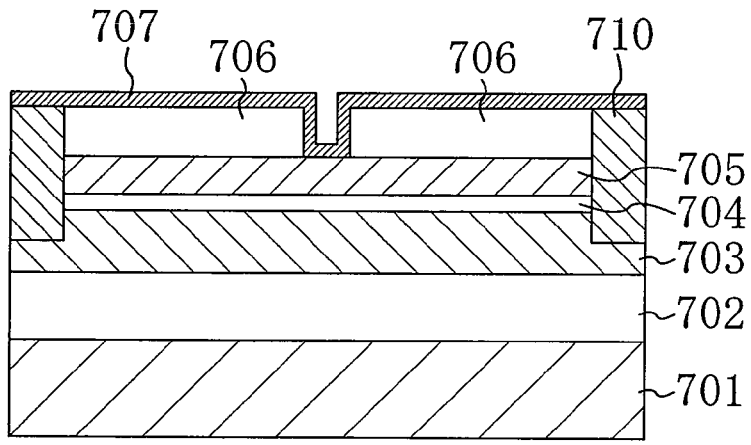
FIGS. 8A, 8B, and 8C are cross-sectional views sequentially illustrating the steps of a method for manufacturing a field effect transistor according to an embodiment of the invention.

As shown in FIG. 8A, a SiN gate insulating film 707 having a thickness of 3 nm is then formed on the whole surface including the wall surface and the bottom surface of the gate recess on the isolation layer 710 and the cap layer 706 by, for example, a plasma CVD (Chemical Vapor Deposition) method. The gate insulating film 707 may be formed by an MOCVD method instead of the plasma CVD method.

Figure 8B:
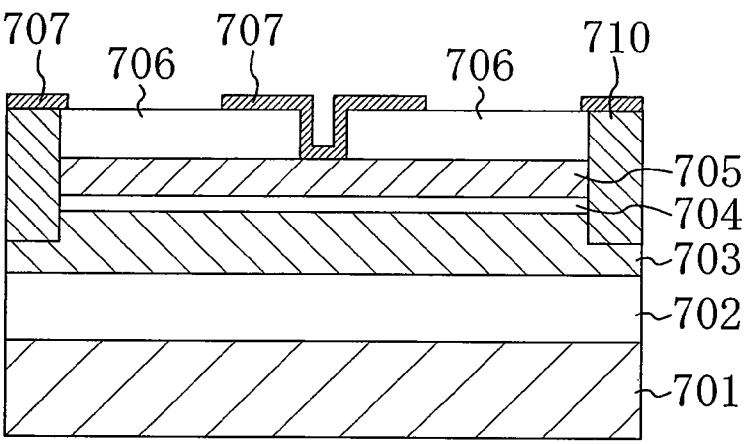

As shown in FIG. 8B, the cap layer 706 is selectively exposed from the gate insulating film 707 by removing the gate insulating film 707 in an ohmic electrode formation region between the gate recess and each isolation layer 710 by a dry etching method. A contact resistance between an ohmic electrode to be formed and the cap layer 706 is thus reduced.

Figure 8C:
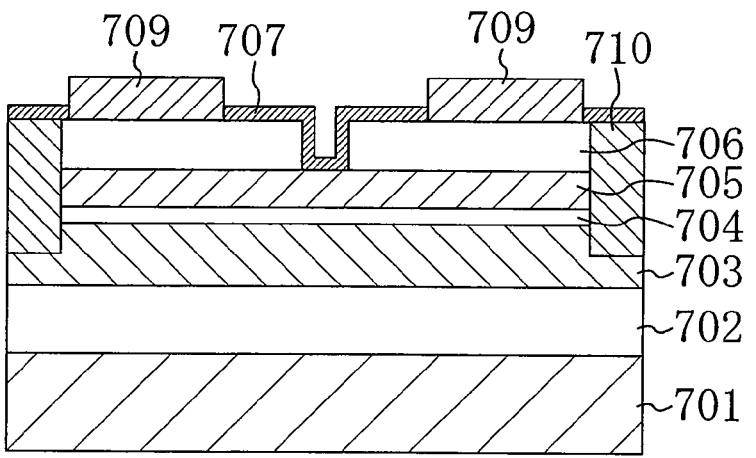

As shown in FIG. 8C, a Ti/Al ohmic electrode (source/drain electrode) 709 is formed on the exposed cap layer 706 by, for example, a sputtering method and a lift-off method. A sintering process is then conducted.

Figure 9:
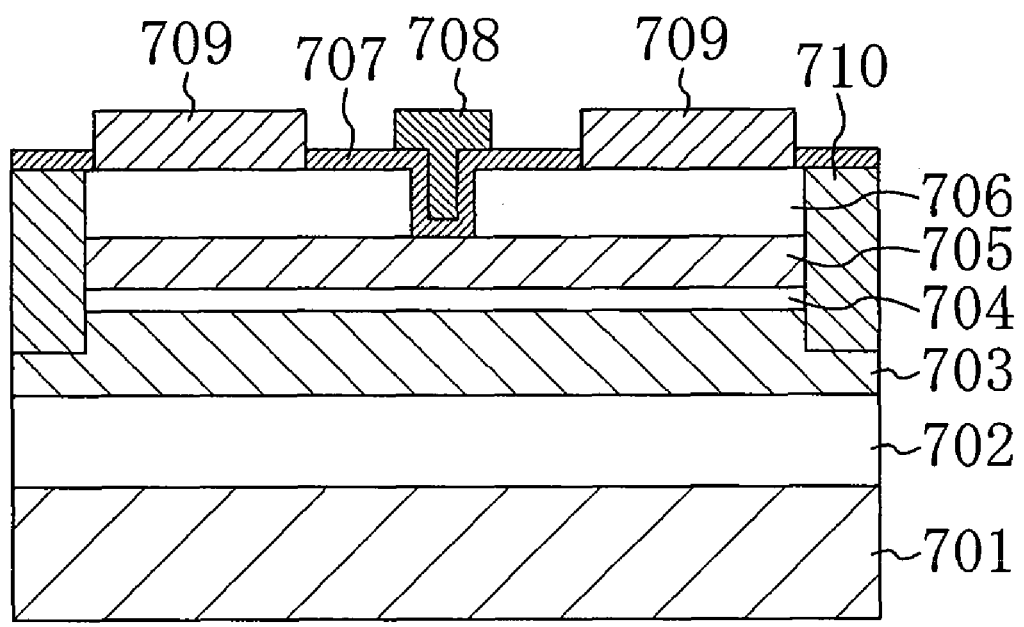
FIG. 9 is a cross-sectional view illustrating a step of a method for manufacturing a field effect transistor according to an embodiment of the invention.

As shown in FIG. 9, a PdSi gate electrode 708 is formed in the gate recess in the cap layer 706 and on the periphery of the gate recess with the gate insulating film 707 interposed therebetween by, for example, a sputtering method and a lift-off method.

The field effect transistor according to the embodiment of the invention is thus obtained. In this embodiment, the substrate 701 for epitaxial growth is a sapphire substrate having an r-plane as a main surface. However, the invention is not limited to sapphire having an r-plane as a main surface. For example, the substrate 701 may be made of SiC, GaN, Si, or the like and any orientation may be used as a main surface of the substrate 701 as long as the same effects as those obtained by sapphire having an r-plane as a main surface can be obtained.

(Modification of the Manufacturing Method)

Hereinafter, a method for manufacturing an a-plane AlGaN/GaN heterojunction field effect transistor according to a modification of the embodiment of the invention will be described with reference to the figures.

FIGS. 10A through 10C, FIGS. 11A through 11C, and FIGS. 12A through 12C show cross-sectional structures sequentially illustrating the steps of the method for manufacturing a field effect transistor according to the modification of the embodiment.

Figure 10A:
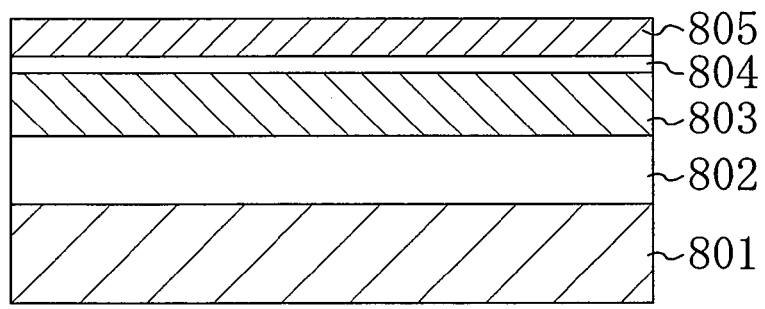
FIGS. 10A, 10B, and 10C are cross-sectional views sequentially illustrating the steps of a method for manufacturing a field effect transistor according to a modification of an embodiment of the invention.

As shown in FIG. 10A, an AlN buffer layer 802 having a thickness of 500 nm, an undoped GaN layer 803 having a thickness of 3 μm, an AlN spacer layer 804 having a thickness of 1 nm, and an $Al_{0.25}Ga_{0.75}N$ barrier layer (electron supply layer) 805 having a thickness of 15 nm are sequentially epitaxially grown on a main surface of a sapphire substrate 801 by, for example, a MOCVD method. The substrate 801 has an r-plane as a main surface, and each of the buffer layer 802, the GaN layer 803, the spacer layer 804, and the barrier layer 805 has an a-plane as a main surface (a growth surface).

Figure 10B:
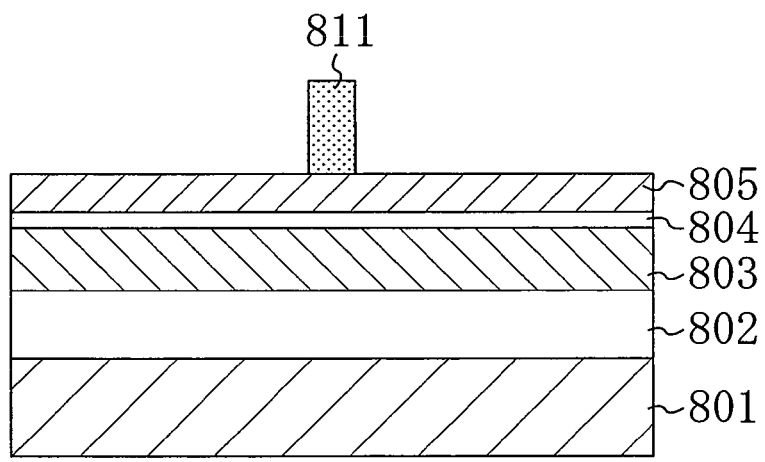

As shown in FIG. 10B, a $SiO_2$ mask film 811 having a thickness of 100 nm is then selectively formed in a gate recess formation region on the barrier layer 805.

Figure 10C:
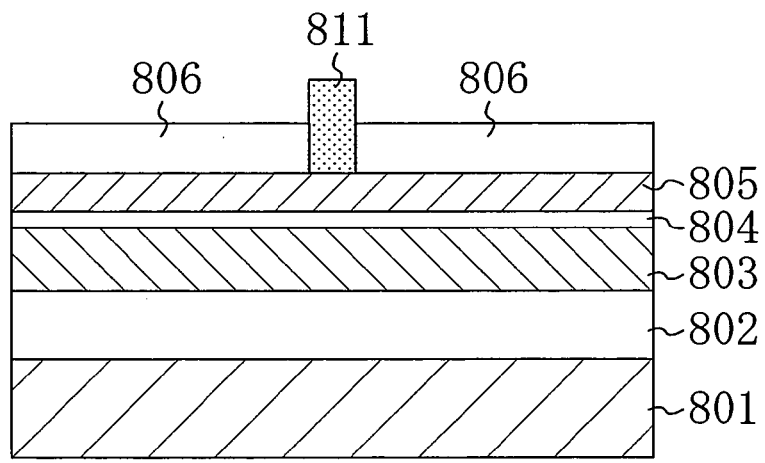

As shown in FIG. 10C, a Si-doped n-type GaN cap layer 806 having an a-plane as a main surface is then formed with a thickness of 50 nm on the barrier layer 805 having the mask film 811 formed thereon by a MOCVD method. The cap layer 806 is grown on the barrier layer 805 except on the mask film 811.

Figure 11A:
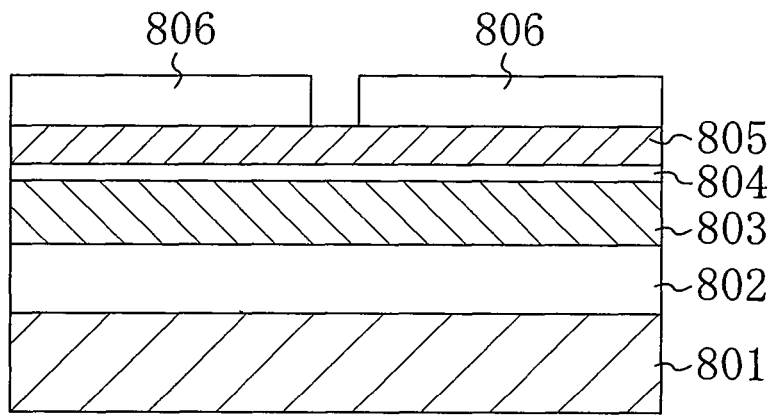
FIGS. 11A, 11B, and 11C are cross-sectional views sequentially illustrating the steps of a method for manufacturing a field effect transistor according to a modification of an embodiment of the invention.

As shown in FIG. 11A, a recess (a gate recess) exposing the barrier layer 805 is then formed in the cap layer 806 by removing the mask film 811 with hydrofluoric acid (HF) or the like. In this modification, when the gate recess structure is formed in the cap layer 806, the exposed surface of the barrier layer 805 from the cap layer 806 is not subjected to damage from plasma processing that is conducted in a dry etching method.

Figure 11B:
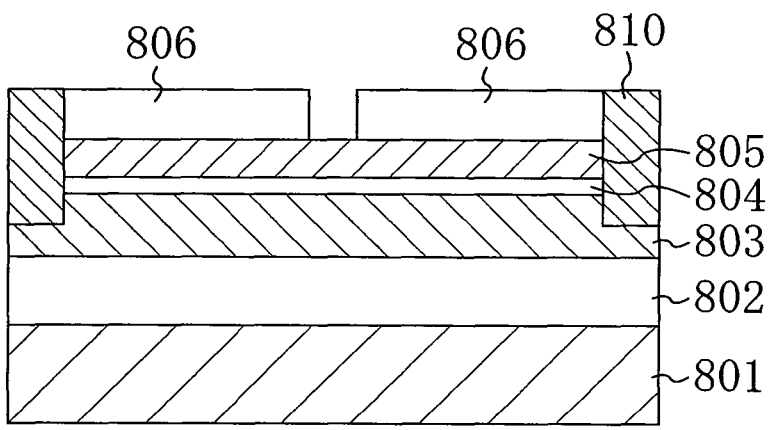

As shown in FIG. 11B, an isolation layer 810 is then formed on both side of the gate recess so that each isolation layer 810 is located at a distance from the gate recess. More specifically, the isolation layer 810 is formed by selectively implanting boron ($B^+$) ions from the cap layer 806 to the upper portion of the GaN layer 803 so as to selectively increase the resistance of each semiconductor layer. The process of increasing the resistance is not limited to the ion implantation method. For example, a selective thermal oxidation method may alternatively be used.

Figure 11C:
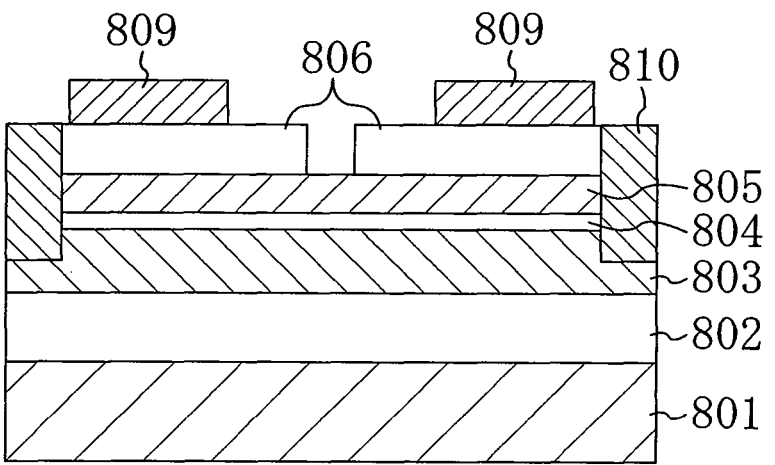

As shown in FIG. 11C, a Ti/Al ohmic electrode (source/drain electrode) 809 is selectively formed in a region between the gate recess and each isolation layer 810 on the cap layer 806 by, for example, a sputtering method and a lift-off method. A sintering process is then conducted.

Figure 12A:
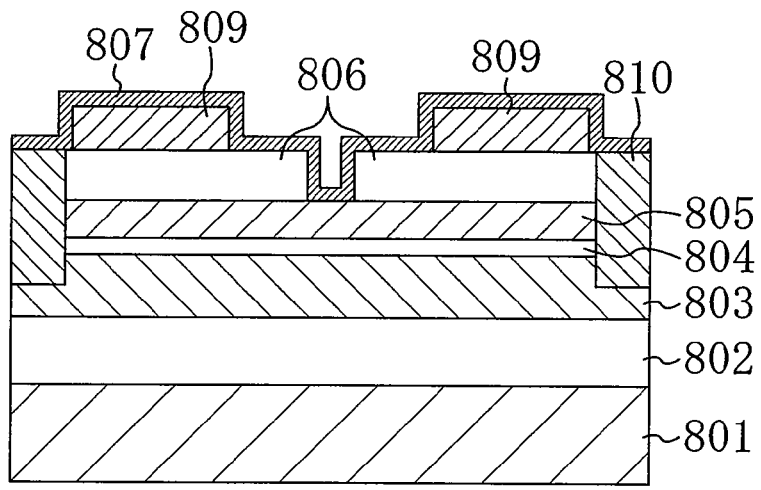
FIGS. 12A, 12B, and 12C are cross-sectional views sequentially illustrating the steps of a method for manufacturing a field effect transistor according to a modification of an embodiment of the invention.

As shown in FIG. 12A, a SiN gate insulating film 807 having a thickness of 3 nm is then formed on the whole surface including the wall surface and the bottom surface of the gate recess on the isolation layer 810, the cap layer 806, and the ohmic electrode 809 by, for example, a plasma CVD method. The gate insulating film 807 may be formed by an MOCVD method instead of the plasma CVD method.

Figure 12B:
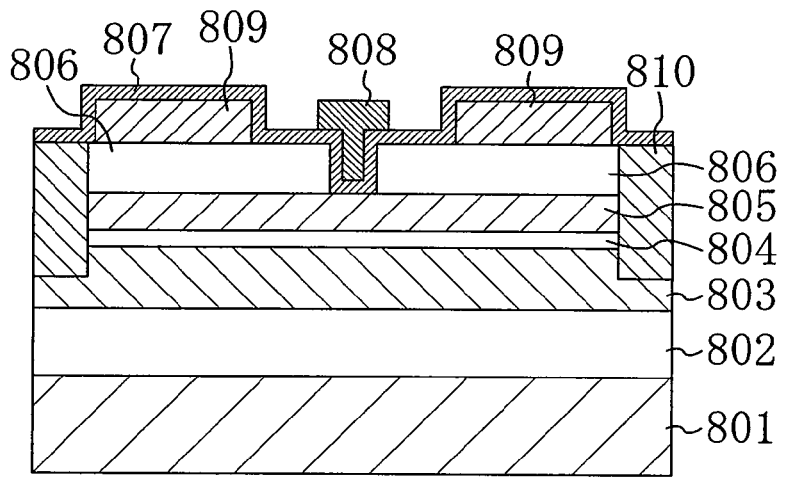

As shown in FIG. 12B, a PdSi gate electrode 808 is then formed in the gate recess in the cap layer 806 and on the periphery of the gate recess with the gate insulating film 807 interposed therebetween by, for example, a sputtering method and a lift-off method.

Figure 12C:
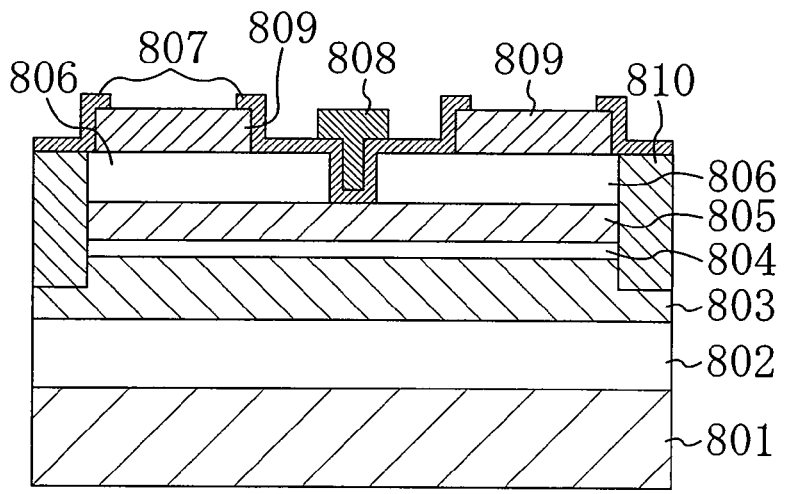

As shown in FIG. 12C, a contact hole exposing the top surface of each ohmic electrode 809 is then selectively formed by removing the gate insulating film 807 on each ohmic electrode 809 by a dry etching method.

According to the manufacturing method of this modification, the barrier layer 805 is not subjected to damage from plasma processing when the gate recess exposing the barrier layer 805 is formed in the cap layer 806. Therefore, a low gate leakage current normally-off type field effect transistor can be obtained.

In this modification, the substrate 801 for epitaxial growth is a sapphire substrate having an r-plane as a main surface. However, the invention is not limited to sapphire having an r-plane as a main surface. For example, the substrate 801 may be made of SiC, GaN, Si, or the like and any orientation may be used as a main surface of the substrate 801 as long as the same effects as those obtained by sapphire having an r-plane as a main surface can be obtained.

As has been described above, a low gate leakage current normally-off type nitride semiconductor field effect transistor that is applicable to, for example, a high power transistor can be implemented by the invention.

What is claimed is:

1. A field effect transistor, comprising:
a first nitride semiconductor layer;
a second nitride semiconductor layer formed on the first nitride semiconductor layer and having a wider bandgap than the first nitride semiconductor layer;
a third nitride semiconductor layer formed on the second nitride semiconductor layer, the first, second and third nitride semiconductor layers being formed on a plane perpendicular to a (0001) plane or a plane tilted with respect to the (0001) plane;
a source electrode and a drain electrode formed so as to contact at least a part of the second nitride semiconductor layer or the third nitride semiconductor layer;
a gate electrode provided between the source electrode and the drain electrode in the third nitride semiconductor layer and formed in a recess that exposes a part of the second nitride semiconductor layer; and
an insulating film formed between the third nitride semiconductor layer and the gate electrode,
wherein the insulating film is formed between the second nitride semiconductor layer and the gate electrode at the recess, and
the insulating film is made of SiN.

2. The field effect transistor according to claim 1, wherein impurities providing n-type conductivity are doped in at least one of the second nitride semiconductor layer and the third nitride semiconductor layer.

3. The field effect transistor according to claim 1, wherein the insulating film is formed so as to cover at least a part of each surface of the source electrode and the drain electrode.

4. The field effect transistor according to claim 1, wherein the field effect transistor has normally-off characteristics.

5. The field effect transistor according to claim 1, wherein the plane perpendicular to the (0001) plane or the plane tilted with respect to the (0001) plane is a (11-20) plane, a (1-100) plane, a (1-101) plane, a (1-102) plane, a (11-22) plane, or a (11-24) plane.

6. The field effect transistor according to claim 1, wherein the first nitride semiconductor layer is made of GaN, the second nitride semiconductor layer is made of $Al_xGa_{1-x}N$ (0<x<1), and the third nitride semiconductor layer is made of GaN.

7. The field effect transistor according to claim 1, wherein the insulating film is a single-layer film of SiN.

8. The field effect transistor according to claim 1, wherein the insulating film fully separates the gate electrode from the second nitride semiconductor layer.

* * * * *